(12) United States Patent
Chang et al.

(10) Patent No.: US 10,347,642 B2
(45) Date of Patent: Jul. 9, 2019

(54) MANUFACTURING METHOD OF SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Chien-Ting Ho, Taichung (TW); Shih-Fang Tzou, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/856,024

(22) Filed: Dec. 27, 2017

(65) Prior Publication Data

US 2018/0190659 A1    Jul. 5, 2018

(30) Foreign Application Priority Data

Dec. 30, 2016    (CN) .......................... 2016 1 1252222

(51) Int. Cl.
| | |
|---|---|
| H01L 21/76 | (2006.01) |
| H01L 23/48 | (2006.01) |
| H01L 23/52 | (2006.01) |
| H01L 29/40 | (2006.01) |
| H01L 29/78 | (2006.01) |
| H01L 21/28 | (2006.01) |

(Continued)

(52) U.S. Cl.
CPC .. *H01L 27/10855* (2013.01); *H01L 21/02071* (2013.01); *H01L 21/28247* (2013.01); *H01L 27/10823* (2013.01); *H01L 27/10876* (2013.01); *H01L 27/10894* (2013.01)

(58) Field of Classification Search
CPC ......... H01L 21/76816; H01L 21/76897; H01L 27/10855; H01L 27/10888; H01L 27/10894
See application file for complete search history.

(56) References Cited

U.S. PATENT DOCUMENTS 6,127,260 A * 10/2000 Huang .............. H01L 21/76838
                                                257/E21.019
6,426,255 B1 * 7/2002 Asano ............... H01L 27/10894
                                                257/295

(Continued)

*Primary Examiner* — Brian Turner
(74) *Attorney, Agent, or Firm* — Winston Hsu

(57) ABSTRACT

A manufacturing method of a semiconductor memory device is provided in the present invention. A cleaning treatment to a storage node contact on a semiconductor substrate is performed, and a metal silicide layer is formed after the cleaning treatment. A gate contact opening penetrating a capping layer of a transistor on the semiconductor substrate is formed after the step of forming the metal silicide layer for exposing a gate structure of the transistor. By the manufacturing method of the semiconductor memory device in the present invention, the gate structure of the transistor may be kept from being influenced and/or damaged by the cleaning treatment of the storage node contact, and the electrical performance of the transistor may be ensured accordingly.

11 Claims, 8 Drawing Sheets

(51) Int. Cl.
*H01L 27/108* (2006.01)
*H01L 21/02* (2006.01)

(56) References Cited

U.S. PATENT DOCUMENTS

| | | | |
|---|---|---|---|
| 6,725,119 B1* | 4/2004 | Wake | H01L 21/02063 134/1.3 |
| 7,445,996 B2 | 11/2008 | McDaniel | |
| 8,586,479 B2 | 11/2013 | Fu | |
| 2004/0094810 A1* | 5/2004 | Maldei | H01L 27/10873 257/411 |
| 2007/0099375 A1* | 5/2007 | Kim | H01L 28/55 438/238 |
| 2010/0210099 A1* | 8/2010 | Hur | H01L 27/11524 438/586 |
| 2012/0100678 A1* | 4/2012 | Sako | H01L 21/76816 438/197 |
| 2013/0119461 A1* | 5/2013 | Kim | H01L 27/10855 257/330 |
| 2014/0299989 A1* | 10/2014 | Lim | H01L 23/48 257/751 |

* cited by examiner

MANUFACTURING METHOD OF SEMICONDUCTOR MEMORY DEVICE

BACKGROUND OF THE INVENTION

1. Field of the Invention

The present invention relates to a manufacturing method of a semiconductor memory device, and more particularly, to a manufacturing method of a semiconductor memory device having a storage contact node.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The MOS transistors of the memory cells may have different structural design because of the product specification and/or the memory cell density requirements. Therefore, the structure of the MOS transistor of the memory cell may be different from that of transistors on other regions within the same chip, and the manufacturing process will become more complicated. Accordingly, it is very important for the related field to effectively integrate the manufacturing process of the MOS transistors in the memory cell and the manufacturing process of the transistors in other regions.

SUMMARY OF THE INVENTION

The present invention provides a manufacturing method of a semiconductor memory device which performs a cleaning treatment to the storage node contact before forming the first metal silicide layer on the storage node contact in the memory cell region to remove impurities on the surface of the storage node contact, and the forming condition of the metal silicide layer can be ensured accordingly. Additionally, after forming the metal silicide layer on the storage node contact, a gate contact opening of a gate structure is formed in the transistor in the peripheral region, so as to ensure that the gate structure exposed by the gate contact opening will not be affected by the cleaning treatment to the storage node contact, thereby achieving the purposes of integrating processes and increasing production yield.

An embodiment of the present invention provides a manufacturing method of a semiconductor memory device, including the following steps. First, a semiconductor substrate is provided, and the semiconductor substrate having a memory cell region and a peripheral region defined thereon. A transistor is formed in the peripheral region, and the transistor includes a gate structure, a cap layer, and a source/drain region. The gate structure is disposed on the semiconductor substrate, the cap layer is disposed on the gate structure, and at least a part of the source/drain region is disposed in the semiconductor substrate. A storage node contact is formed in the memory cell region, and a cleaning treatment is performed to the storage node contact. A first metal silicide layer is formed on the storage node contact after the cleaning treatment. A gate contact opening is formed to penetrate the cap layer for exposing the gate structure after forming the first metal silicide.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic diagrams illustrating a manufacturing method of a semiconductor memory device according to a first embodiment of the present invention, wherein:
FIG. 2 is a fabricating stage following FIG. 1;
FIG. 3 is a fabricating stage following FIG. 2;
FIG. 4 is a fabricating stage following FIG. 3; and
FIG. 5 is a fabricating stage following FIG. 4.
FIGS. 6-8 are schematic diagrams illustrating a manufacturing method of a semiconductor memory device according to a second embodiment of the present invention, wherein:
FIG. 7 is a fabricating stage following FIG. 6; and
FIG. 8 is a fabricating stage following FIG. 7.

DETAILED DESCRIPTION

Figure 1:
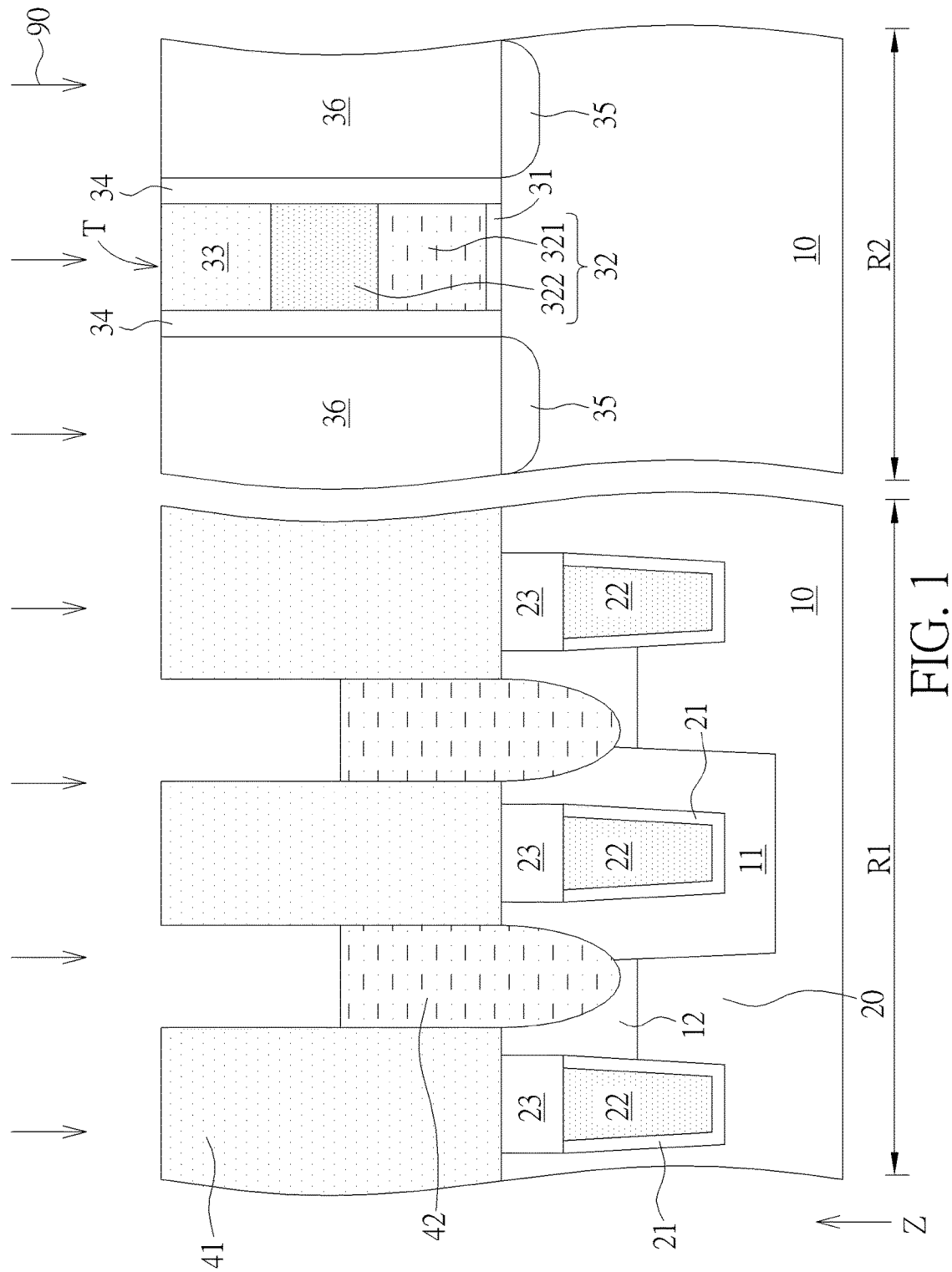

Please refer to FIGS. 1-5. FIGS. 1-5 are schematic diagrams illustrating a manufacturing method of a semiconductor memory device according to a first embodiment of the present invention. The manufacturing method of the semiconductor memory device provided in this embodiment includes the following steps. First, as shown in FIG. 1, a semiconductor substrate 10 is provided, and the semiconductor substrate 10 has a memory unit region R1 and a peripheral region R2 defined thereon. A plurality of memory cells may be formed in the memory unit region R1, and other devices other than the memory cells may be formed in the peripheral region R2, such as transistors for controlling word lines and/or bit lines, but not limited thereto. The semiconductor substrate 10 may include a silicon substrate, an epitaxial silicon substrate, a silicon germanium substrate, a silicon carbide substrate or a silicon-on-insulator (SOI) substrate, but not limited herein. In this embodiment, a shallow trench isolation 11 may be formed in the memory unit region R1 of the semiconductor substrate 10 for defining a plurality of active regions 20 in the memory unit region R1 of the semiconductor substrate 10. The shallow trench isolation 11 may be formed by using etching method to form a plurality of trenches in the memory cell region R1 of the semiconductor substrate 10 and followed by filling the trenches with an insulation material, such as silicon oxide, but not limited thereto. In some embodiments, the shallow trench isolation 11 may be formed by other suitable method based on the requirements. Furthermore, a plurality of word lines 22 may be formed in the memory cell region R1 of the semiconductor substrate 10, and each word line 22 of this embodiment may be a buried word line, but not limited thereto. The word lines 22 may be formed in the semiconductor substrate 10 and the shallow trench isolation 11 by using burying method. A first gate dielectric layer 21 may be formed between each word line 22 and the semiconductor substrate 10, and a word line cap layer 23 may be formed on each word line 22 to cover each word line 22. The above mentioned first gate dielectric layer 21, word lines 22 and word line cap layer 23 may be formed through forming a plurality of trenches in the semiconductor substrate 10 and the shallow trench isolation 11 first and then sequentially forming the first gate dielectric layer 21, the word lines 22 and the word line cap layer 23 in the trenches, but not limited thereto. In some embodiments, the first gate dielectric layer 21 may include silicon oxide or other suitable dielectric material, the word lines 22 may include aluminum (Al), tungsten (W), copper (Cu), alloy of titanium and aluminum (TiAl) or other suitable conductive materials, and the word line cap layer 23 may include silicon nitride, silicon oxynitride, silicon carbon nitride (SiCN) or other suitable insulation materials. Additionally, a first source/drain region 12 may be formed in each active region 20, so that the first source/drain region 12, each word line 22 and the first gate dielectric layer 21 may form a transistor part of the memory cell. In some embodiments, the first source/drain region 12 may be formed by doping a part of each active region 20, but not limited thereto.

In this embodiment, a transistor T is formed in the peripheral region R2. The transistor T in the peripheral region R2 may include the transistors for controlling the word lines and/or bit lines, but not limited thereto. The transistor T includes a gate structure 32, a cap layer 33 and a source/drain region (for example the second source/drain region 35 shown in FIG. 1). The gate structure 32 is disposed on the semiconductor substrate 10, the cap layer 33 is disposed on the gate structure 32, and the second source/drain region 35 is at least partly disposed in the semiconductor substrate 10. Furthermore, the transistor T may further include a gate dielectric layer (for example the second gate dielectric layer 31 shown in FIG. 1) disposed between the gate structure 32 and the semiconductor substrate 10, a spacer 34 may be formed on a sidewall of the gate structure 32 and a sidewall of the cap layer 33, and a dielectric layer 36 may be formed on the semiconductor substrate 10 and to cover the second source/drain region 35. In some embodiments, the second source/drain region 35 may be formed by doping the semiconductor substrate 10, but not limited thereto. In some embodiment, the gate structure 32 may include a stack of a silicon layer 321 and a metal gate 322, and a barrier layer (not shown) may be disposed between the silicon layer 321 and metal gate 322 according to the requirements. The silicon layer 321 may include polysilicon, amorphous silicon or other silicon containing conductive materials, the metal gate 322 may include aluminum, tungsten, copper, alloy of titanium aluminum or other suitable conductive material with low resistance, and the cap layer 33 may include silicon nitride, silicon oxynitride, silicon carbon nitride (SiCN) or other suitable insulation materials. Additionally, in some embodiments, the gate structure 32 and the cap layer 33 may be formed together with the bit line structure (not shown) by the same process, so as to achieve the effects of simplifying processes and integrating processes, but not limited thereto.

Next, a storage node contact 42 is formed in the memory cell region R1, and the storage node contact 42 is electrically connected to the first source/drain region 12. The storage node contact 42 may be formed by forming an isolation structure 41 with a plurality of openings on the semiconductor substrate 10, filling the openings of the isolation structure 41 with a conductive material, and then performing an etching back process to the conductive material, so that a top surface of the storage node contact 42 is lower than a top surface of the isolation structure 41 in a vertical direction Z, and the top surface of the storage node contact 42 is higher than a top surface of the semiconductor substrate 10 and a top surface of the second source/drain region 35, but not limited herein. In some embodiments, the storage node contact 42 may be formed by other processes according to the requirements. Thereafter, a cleaning treatment 90 is performed to the storage node contact 42 so as to remove impurities, oxide and/or etching residue or derivatives generated in the above etching back process on the surface of the storage node contact 42. Furthermore, in some embodiments, the cleaning treatment 90 may be used to improve the condition of the uneven surface of the storage node contact 42 resulted from the above mentioned etching back process, so as to ensure the condition of the metal silicide layer formed on the storage node contact in the following processes. For example, the storage node contact 42 may include silicon, such as amorphous silicon, polysilicon or other silicon containing conductive material, and the cleaning treatment 90 may include a dry cleaning treatment (for example a cleaning treatment of SiCoNi) using a mixed gas of nitrogen trifluoride and ammonia, but not limited thereto. In some embodiments, the storage node contact 42 may be cleaned by using other dry or wet cleaning treatment, such as SC1 cleaning or a buffer oxide etch (BOE) cleaning, according to requirements. It is worthy to note that the gate structure 32 in the peripheral region R2 is covered with the cap layer 33 during performing the cleaning treatment 90, so when a material of the gate structure 32 is capable of being etched by the cleaning treatment 90, the gate structure 32 can be kept from being influenced by the cleaning treatment 90 because the gate structure 32 is covered with the gate structure 32.

Figure 2:
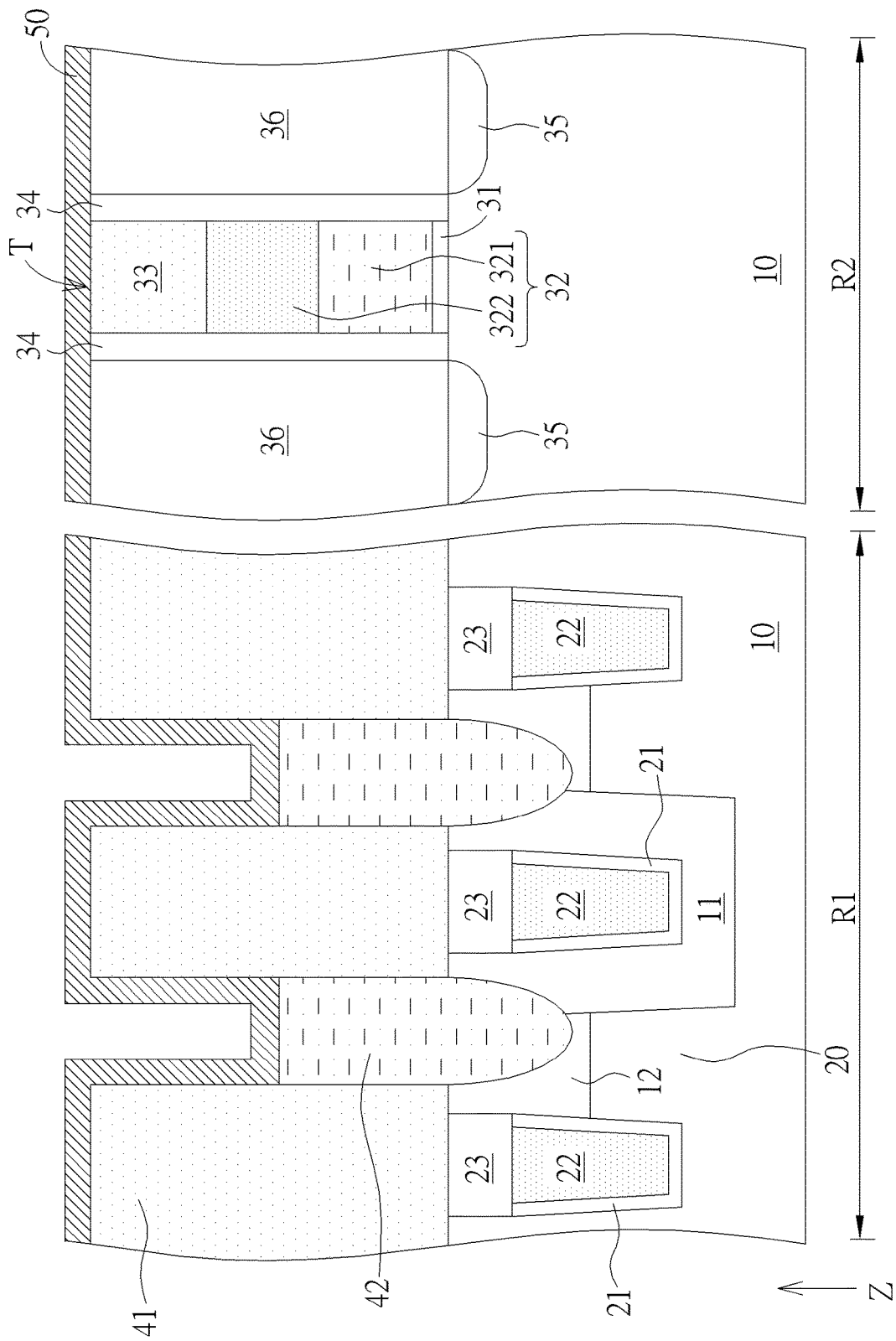
Figure 3:
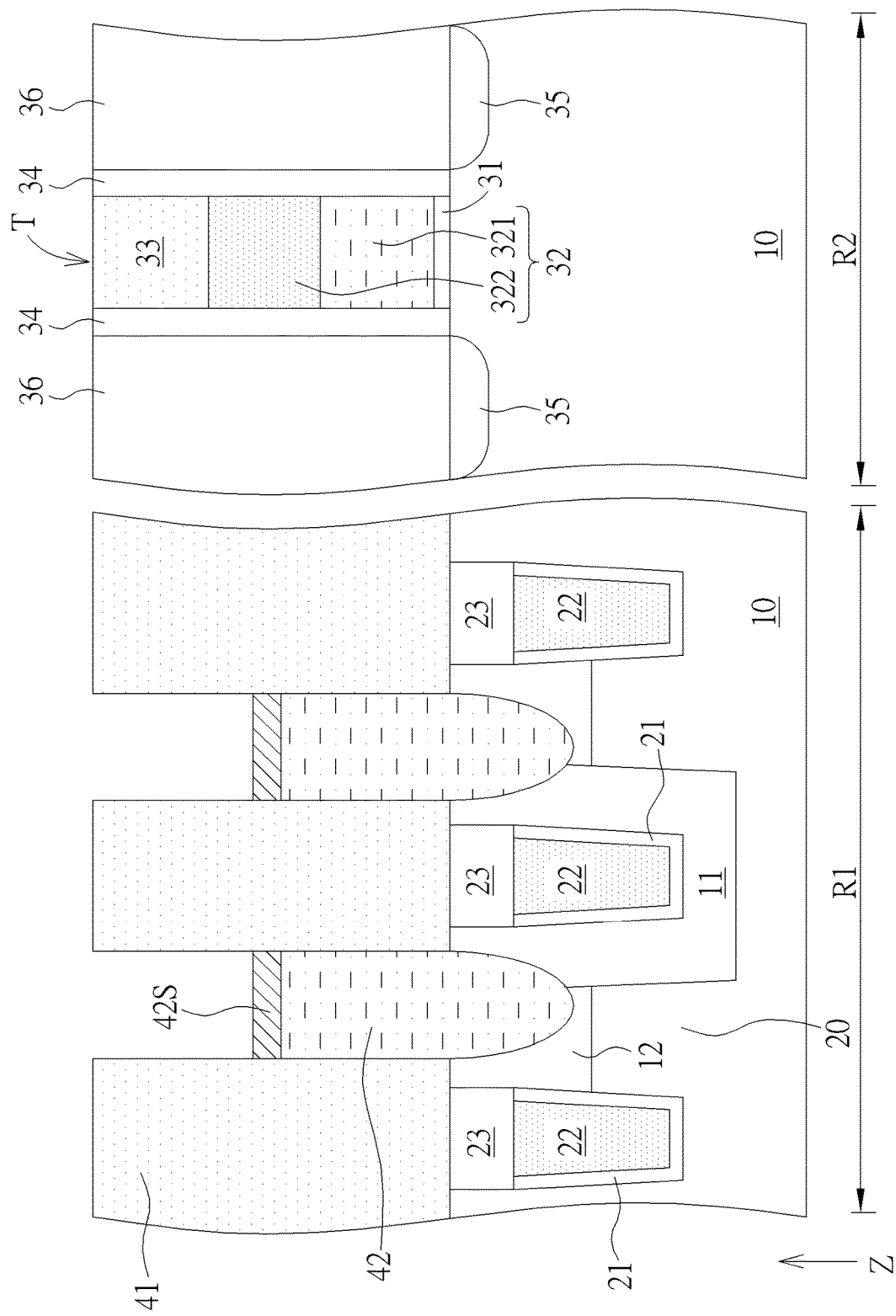

Next, as shown in FIGS. 1-3, after the cleaning treatment 90, a first metal silicide layer 42S is formed on the storage node contact 42. The forming method of the metal silicide 42S may include, but not limited thereto, the following steps. First, a metal layer 50 is formed to cover the surface of the storage node contact 42 and followed by performing a thermal treatment to form the first metal silicide layer 42S on the storage node contact 42, and the metal layer 50 is removed after the first metal silicide layer 42S is formed. In some embodiments, the metal layer 50 may include cobalt (Co), nickel (Ni) or other suitable metal materials, and the first metal silicide layer 42S may include cobalt-silicide, nickel-silicide or other suitable metal silicide. Furthermore, the metal layer 50 may be formed by using a deposition device, such as a physical vapor deposition (PVD) device, and the above-mentioned cleaning treatment performed to the storage node contact 42 may be performed in the same deposition device so as to mitigate bad influence from the outer environment on the surface of the storage node contact 42 in a waiting period between the cleaning treatment and forming the metal layer 50, but not limited thereto.

Figure 4:
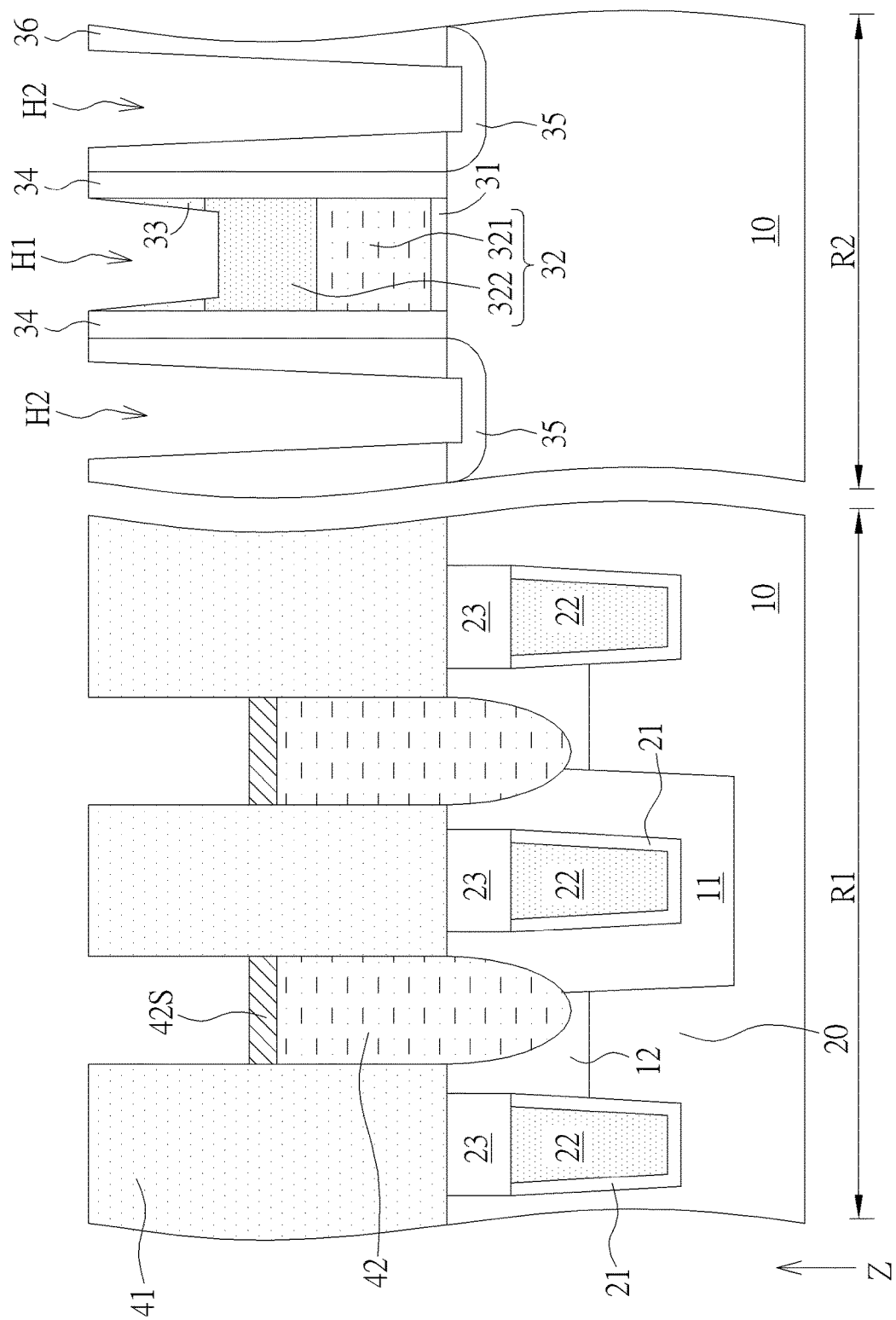

Then, as shown in FIGS. 3-4, after the first metal silicide layer 42S is formed, a gate contact opening H1 is formed to penetrate through the cap layer 33 and expose the gate structure 32. That is to say, the gate contact opening H1 may expose the metal gate 322 of the gate structure 32. Additionally, a contact opening H2 is formed in the dielectric layer 36 covering the second source/drain region 35, and the contact opening H2 exposes at least a part of the second source/drain region 35. The gate contact opening H1 and the contact opening H2 are formed after the step of forming the storage node contact 42, and the gate contact opening H1 and the contact opening H2 are formed after the step of forming the first metal silicide layer 42S in this embodiment. Moreover, in some embodiments, the contact opening H2 may be formed together with the gate contact opening H1, so as to simplify the processes, but not limited thereto.

Figure 5:
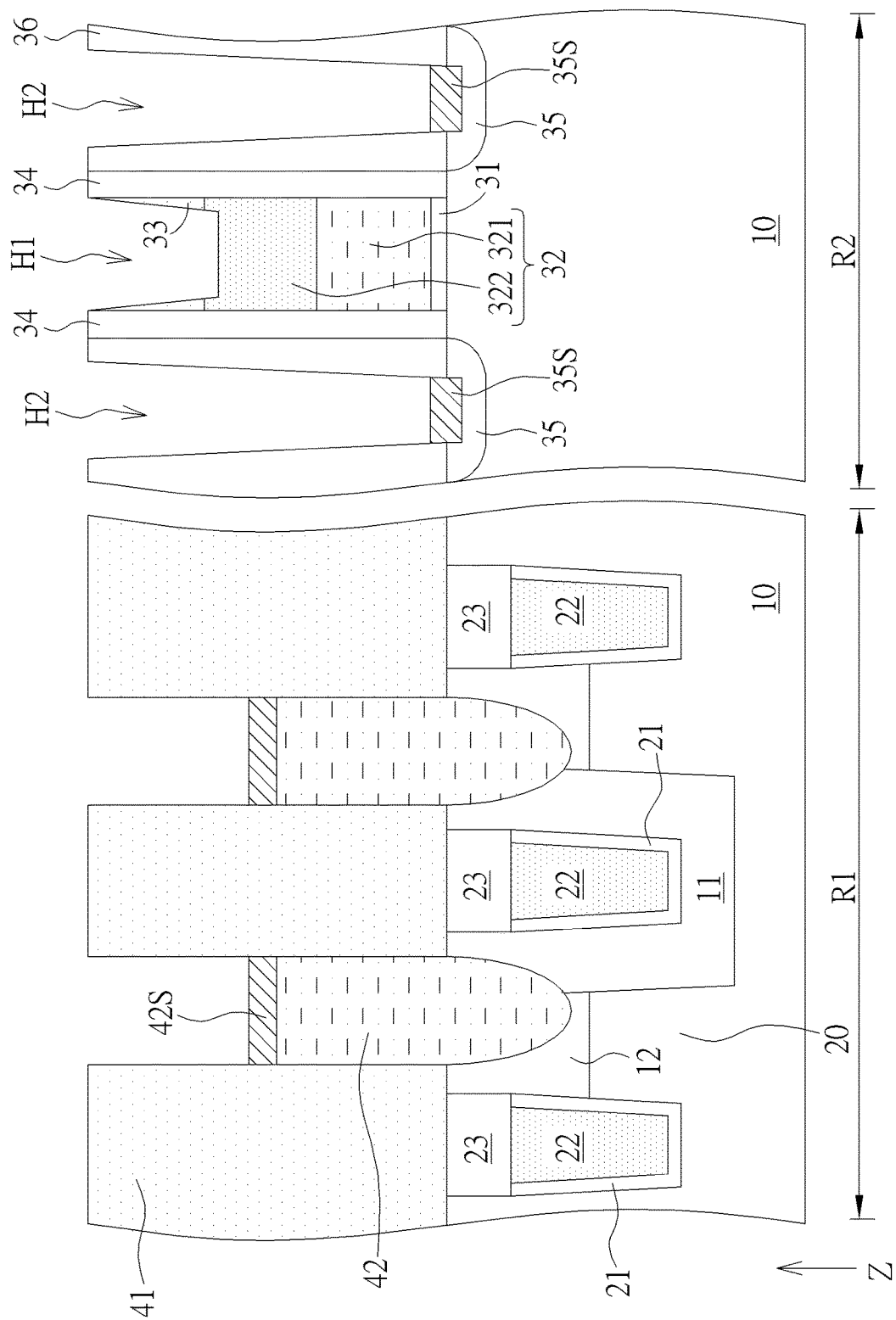

Subsequently, as shown in FIGS. 4-5, a metal silicide layer 35S is formed on the second source/drain region 35 exposed by the contact opening H2. The forming method of the second metal silicide layer 35S may be similar to that of the first metal silicide layer 42S, and a material of the second metal silicide layer 35S may also be the same as the material of the first metal silicide layer 42S, but not limited thereto. In some embodiments, the forming method and/or the material of the second metal silicide layer 35S may be different from the first metal silicide layer 42S according to the requirements. Furthermore, before forming the second metal silicide layer 35S, the cleaning treatment to the storage node contact 42 as mentioned above is not performed to the second source/drain region 35 exposed by the contact opening H2, so as to keep the gate structure 32 exposed by the gate contact opening H1 from being damaged. In some embodiments, other cleaning treatment may be performed to the second source/drain region 35 exposed by the contact opening H2 before forming the second metal silicide layer 35S, and the cleaning treatment to the second source/drain region 35 is different from the cleaning treatment to the storage node contact 42 and doesn't result in etching to the gate structure 32 and/or other unwanted influence on the gate structure 32. Thereafter, a gate contact plug (not shown) and a source/drain contact plug (not shown) may be formed in the gate contact opening H1 and the contact opening H2 respectively, the gate contact plug may be electrically connected to the gate structure 32, and the source/drain contact plug may be electrically connected to the second source/drain region 35 through the second metal silicide layer 35S.

Figure 6:
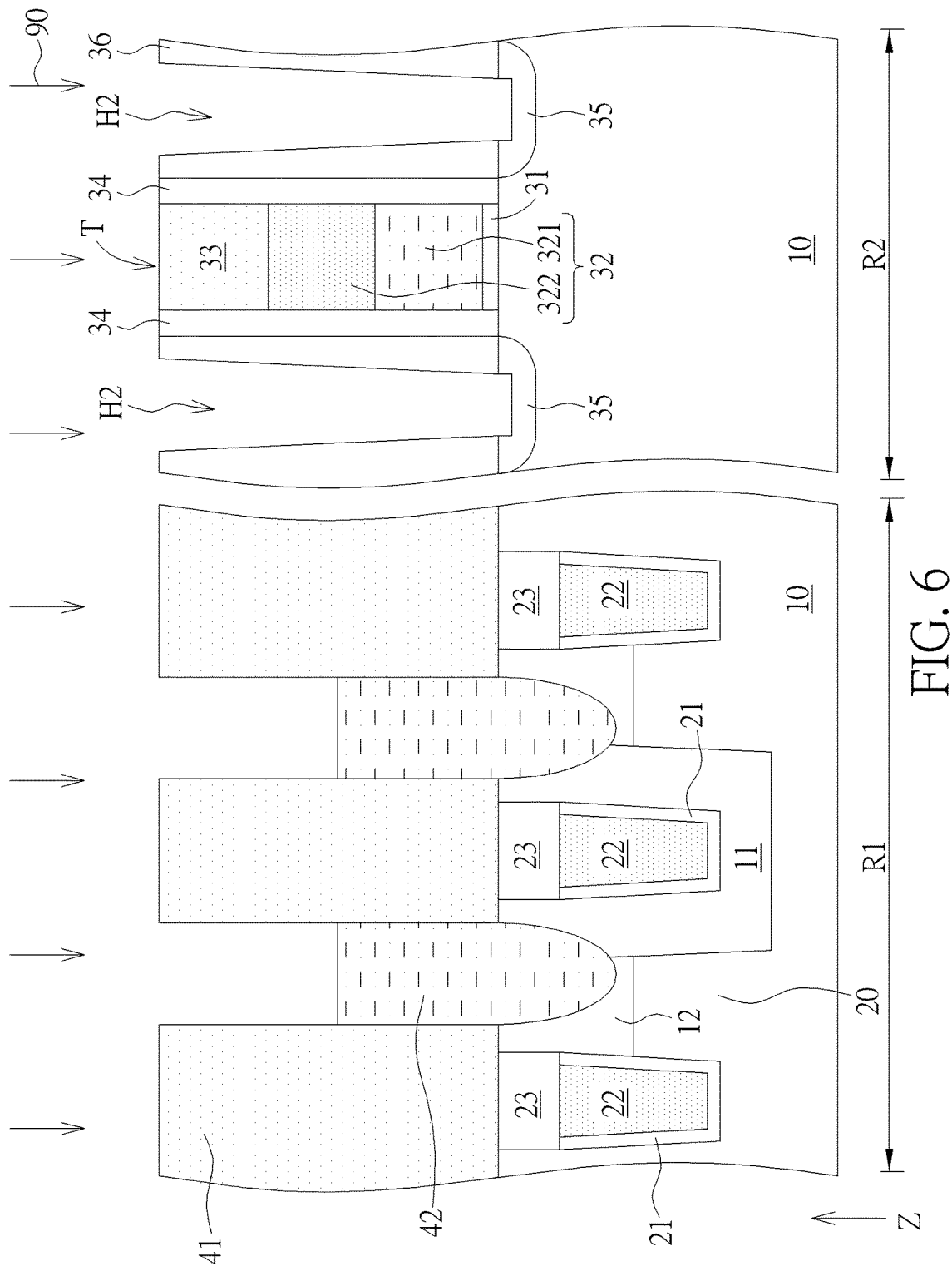
Figure 7:
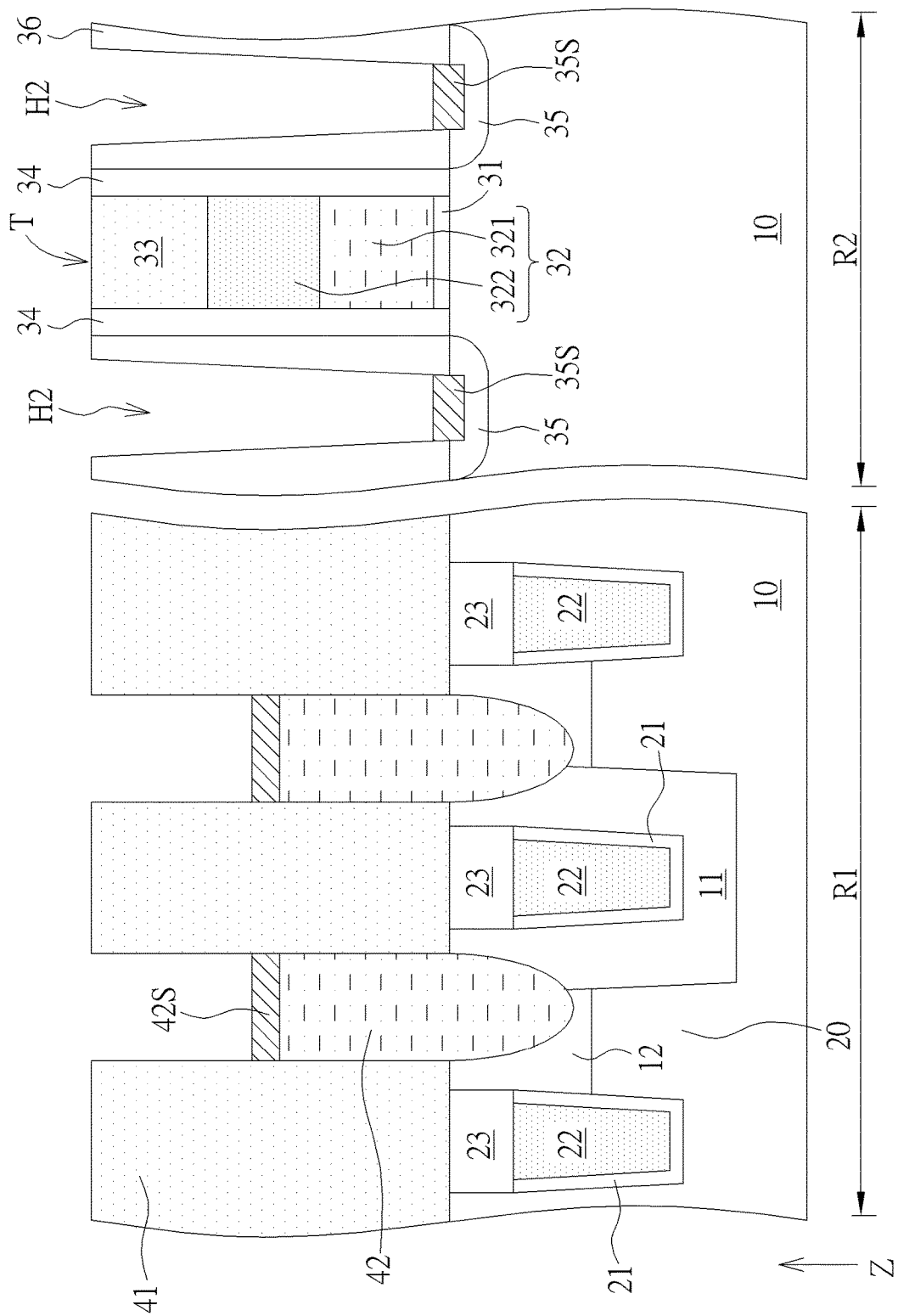
Figure 8:
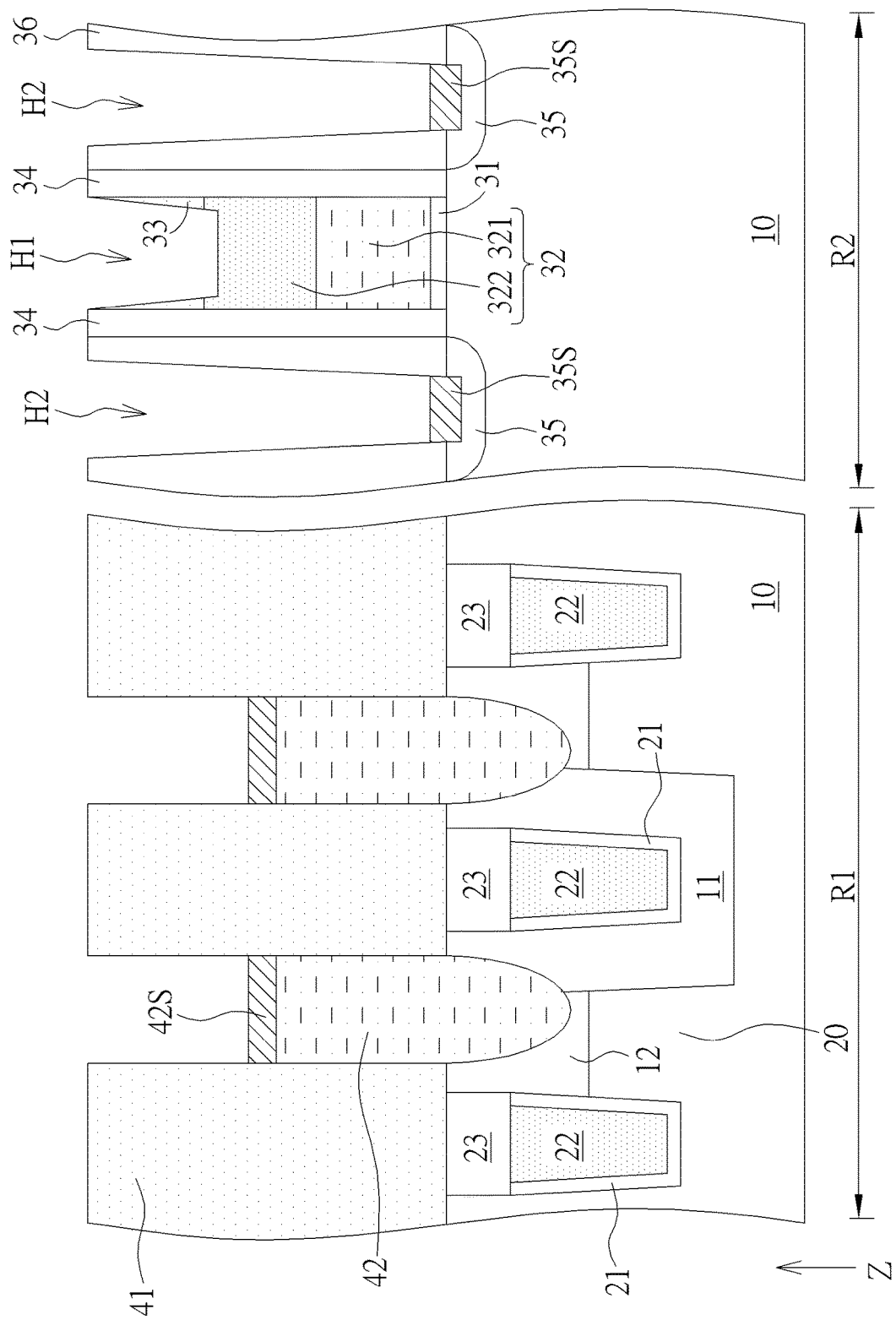

Please refer to FIGS. 6-8. FIGS. 6-8 are schematic diagrams illustrating a manufacturing method of a semiconductor memory device according to a second embodiment of the present invention. The difference between this embodiment and the first embodiment is that the contact opening H2 may be formed before the cleaning treatment 90 in this embodiment, so the second source/drain region 35 exposed by the contact opening H2 is exposed in the cleaning treatment 90, as shown in FIG. 6. Then, as shown in FIGS. 6-7, after the cleaning treatment 90, the first metal silicide layer 42S is formed on the storage node contact 42, and the second metal silicide layer 35S is formed on the second source/drain region 35. In other words, the contact opening H2 is formed before the first metal silicide layer 42S is formed, and the second metal silicide layer 35S and the first metal silicide layer 42S can be formed at the same time by the same process. Next, as shown in FIG. 8, after the first metal silicide layer 42S and the second metal silicide layer 35S are formed, the gate contact opening H1 is formed to penetrate the cap layer 33 for exposing the gate structure 32. Through the manufacturing method of this embodiment, the surface of the second source/drain region 35 can be cleaned by the cleaning treatment before forming the second metal silicide layer 35S, so as to ensure the forming condition and quality of the second metal silicide layer 35S.

As the above-mentioned description, in the manufacturing method of the semiconductor memory device of the present invention, the cleaning treatment is performed to the storage node contact before forming the first metal silicide layer on the storage node contact in the memory cell region for improving the surface condition of the storage node contact, so that the forming condition and quality of the first metal silicide layer can be ensured. After forming the first metal silicide layer on the storage node contact, the gate contact opening of the gate structure is formed in the transistor in the peripheral region, so as to ensure that the gate structure exposed by the gate contact opening would not be influenced by the cleaning treatment to the storage node contact, thereby achieving the effects of integrating processes and increasing production yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor memory device, comprising:
   providing a semiconductor substrate, the semiconductor substrate having a memory cell region and a peripheral region defined thereon;
   forming a transistor in the peripheral region, the transistor comprising:
      a gate structure, disposed on the semiconductor substrate;
      a cap layer, disposed on the gate structure; and
      a source/drain region, at least partly disposed in the semiconductor substrate;
   forming a storage node contact in the memory cell region, wherein the storage node contact is formed after forming the transistor;
   performing a cleaning treatment to the storage node contact;
   forming a first metal silicide layer on the storage node contact after the cleaning treatment, wherein the step of forming the first metal silicide layer comprises:
      forming a metal layer covering a surface of the storage node contact and the transistor; and
      performing a thermal treatment to the metal layer for forming the first metal silicide layer, wherein the metal layer is removed after forming the first metal silicide layer, and the metal layer directly contacts the cap layer during the thermal treatment; and
   forming a gate contact opening to penetrate the cap layer for exposing the gate structure after forming the first metal silicide.

2. The manufacturing method of the semiconductor memory device according to claim 1, wherein a material of the gate structure is capable of being etched by the cleaning treatment, and the gate structure is covered with the cap layer during performing the cleaning treatment.

3. The manufacturing method of the semiconductor memory device according to claim 2, wherein the cleaning treatment comprises a dry cleaning treatment using nitrogen trifluoride and ammonia.

4. The manufacturing method of the semiconductor memory device according to claim 1, wherein the storage node contact comprises silicon.

5. The manufacturing method of the semiconductor memory device according to claim 1, wherein the gate structure comprises a metal gate, and the gate contact opening exposes the metal gate.

6. The manufacturing method of the semiconductor memory device according to claim 1, further comprising:
   forming a dielectric layer on the semiconductor substrate, wherein the dielectric layer covers the source/drain region;
   forming a contact opening in the dielectric layer, wherein the contact opening exposes at least a part of the source/drain region, and the contact opening is formed after the step of forming the storage node contact; and
   forming a second metal silicide layer on the source/drain region exposed by the contact opening.

7. The manufacturing method of the semiconductor memory device according to claim 6, wherein the contact opening is formed together with the gate contact opening.

8. The manufacturing method of the semiconductor memory device according to claim 6, wherein the contact opening is formed before the first metal silicide is formed.

9. The manufacturing method of the semiconductor memory device according to claim 8, wherein the second metal silicide layer is formed together with the first metal silicide layer.

10. The manufacturing method of the semiconductor memory device according to claim 8, wherein the contact opening is formed before the cleaning treatment, and the source/drain region is exposed in the cleaning treatment.

11. The manufacturing method of the semiconductor memory device according to claim 1, wherein the step of forming the storage node contact comprises:

forming an isolation structure with an opening on the semiconductor substrate;

filling the opening of the isolation structure with a conductive material; and performing an etching back process to the conductive material, wherein the conductive material in the opening is etched back to be the storage node contact, a topmost surface of the storage node contact is lower than a topmost surface of the isolation structure in a vertical direction, and a topmost surface of the first metal silicide layer is lower than the topmost surface of the isolation structure in the vertical direction.

\* \* \* \* \*